US009841922B2

(12) United States Patent
Park et al.

(10) Patent No.: US 9,841,922 B2
(45) Date of Patent: Dec. 12, 2017

(54) MEMORY SYSTEM INCLUDES A MEMORY CONTROLLER

(71) Applicant: SK hynix Inc., Gyeonggi-do (KR)

(72) Inventors: Jae-Han Park, Gyeonggi-do (KR); Hyun-Woo Kwack, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/423,012

(22) Filed: Feb. 2, 2017

(65) Prior Publication Data

US 2017/0220294 A1    Aug. 3, 2017

Related U.S. Application Data

(60) Provisional application No. 62/290,697, filed on Feb. 3, 2016.

(51) Int. Cl.
*G11C 11/34* (2006.01)
*G06F 3/06* (2006.01)

(52) U.S. Cl.
CPC .......... *G06F 3/0647* (2013.01); *G06F 3/0604* (2013.01); *G06F 3/0683* (2013.01)

(58) Field of Classification Search
CPC ... G11C 7/10; G11C 11/4093; G11C 11/4096; G11C 5/06
See application file for complete search history.

(56) References Cited

U.S. PATENT DOCUMENTS

| 9,037,774 | B2 * | 5/2015 | Solomon | G11C 5/04 |
| | | | | 711/147 |
| 2006/0291263 | A1 * | 12/2006 | Wallner | G11C 5/063 |
| | | | | 365/63 |
| 2007/0260841 | A1 * | 11/2007 | Hampel | G06F 13/1684 |
| | | | | 711/167 |
| 2008/0158956 | A1 * | 7/2008 | Im | G08B 13/1409 |
| | | | | 365/185.05 |
| 2013/0314968 | A1 * | 11/2013 | Shaeffer | G11C 5/04 |
| | | | | 365/51 |
| 2014/0040568 | A1 * | 2/2014 | Lee | G11C 5/025 |
| | | | | 711/154 |
| 2015/0212953 | A1 * | 7/2015 | Ware | G11C 7/1021 |
| | | | | 711/105 |
| 2016/0117101 | A1 * | 4/2016 | Choi | G06F 3/061 |
| | | | | 711/103 |
| 2016/0267954 | A1 * | 9/2016 | Sun | G11C 5/04 |

* cited by examiner

*Primary Examiner* — Tuan T Nguyen
(74) *Attorney, Agent, or Firm* — IP & T Group LLP

(57) ABSTRACT

A memory system includes a memory controller, a first memory module including first and second groups of first memory chips, a second memory module including first and second groups of second memory chips, and a channel including a first group of signal lines suitable for coupling the memory controller with the first memory module, and a second group of signal lines suitable for coupling the memory controller with the second memory module.

20 Claims, 8 Drawing Sheets

MEMORY SYSTEM INCLUDES A MEMORY CONTROLLER

CROSS-REFERENCE TO RELATED APPLICATION

This application claims priority to U.S. Patent Application No. 62/290,697, entitled "MEMORY SYSTEM" filed on Feb. 3, 2016 which is herein incorporated by reference in its entirety.

TECHNICAL FIELD

This patent document relates to a memory system.

DISCUSSION OF THE RELATED ART

FIG. 1 is a configuration diagram illustrating a memory system including a memory controller 110 and two memory modules 120 and 130.

Referring to FIG. 1, the memory modules 120 and 130 may include a plurality of memory chips DRAM0 to DRAM15, registering clock drivers 121 and 131 and a plurality of buffer chips DB0 to DB7, respectively.

The memory chips DRAM0 to DRAM15 may be controlled by command signals, address signals and a clock signal provided from the memory controller 110. The memory chips DRAM0 to DRAM15 may store data provided from the memory controller 110 and may read out stored data to the memory controller 110.

The registering clock drivers 121 and 131 may transfer to the plurality of respective memory chips DRAM0 to DRAM15 the command signals, the address signals and the clock signal provided from the memory controller 110.

Each of the buffer chips DB0 to DB7 may buffer the data transferred between the memory controller 110 and one or more corresponding memory chips among the plurality of memory chips DRAM0 to DRAM15.

Signals are transferred between the memory controller 110 and the memory modules 120 and 130 through a channel CHANNEL which couples the memory controller 110 and the memory modules 120 and 130. The channel CHANNEL typically includes a plurality of lines for transferring the various signals. All the lines included in the channel CHANNEL are shared by the memory modules 120 and 130. However, in the case where at least two memory modules 120 and 130 share lines in this way, the quality of the signals transferred through the lines may deteriorate. In FIG. 1, illustration of the plurality of the lines of the channel CHANNEL for transferring the various signals between the registering clock drivers 121 and 131 and the respective memory chips DRAM0 to DRAM15 is omitted.

SUMMARY

Various embodiments are directed to a memory system with reduced loading of a channel transferring signals between a memory module and a memory controller.

In an embodiment, a memory system may include: a memory controller; a first memory module including first and second groups of first memory chips; a second memory module including first and second groups of second memory chips; and a channel including a first group of signal lines suitable for coupling the memory controller with the first memory module, and a second group of signal lines suitable for coupling the memory controller with the second memory module.

The first memory module may further include first and second groups of first buffer chips, and the second memory module may further include first and second groups of second buffer chips.

The first buffer chips of the first group may be coupled between the first memory chips of the first group and the signal lines of the first group, and the second buffer chips of the second group may be coupled between the second memory chips of the second group and the signal lines of the second group.

The first memory chips of the first group may exchange data with the signal lines of the first group through the first buffer chips of the first group, and the first memory chips of the second group may exchange data with the signal lines of the first group through the first memory chips of the first group and the first buffer chips of the first group.

The second memory chips of the second group may exchange data with the signal lines of the second group through the second buffer chips of the second group, and the second memory chips of the first group may exchange data with the signal lines of the second group through the second memory chips of the second group and the second buffer chips of the second group.

The first memory module may further include first data buses suitable for transferring data between the first memory chips of the first group and the first memory chips of the second group, and the second memory module may further include second data buses suitable for transferring data between the second memory chips of the first group and the second memory chips of the second group.

The first memory chips of the first group may exchange data with the first buffer chips of the first group in the case where a first path is selected, and the first memory chips of the first group may transfer data between the first memory chips of the second group coupled with the first data buses and the first buffer chips of the first group in the case where a second path is selected.

The second memory chips of the second group may exchange data with the second buffer chips of the second group in the case where a third path is selected, and the second memory chips of the second group may transfer data between the second memory chips of the first group coupled with the second data buses and the second buffer chips of the second group in the case where a fourth path is selected.

The first memory module may further include a first registering clock driver, and the second memory module may further include a second registering clock driver.

The first memory chips of the first group and the first buffer chips of the first group may be disposed on a first side of the first registering clock driver, and the first memory chips of the second group and the first buffer chips of the second group may be disposed on a second side of the first registering clock driver.

The second memory chips of the first group and the second buffer chips of the first group may be disposed on the first side of the second registering clock driver, and the second memory chips of the second group and the second buffer chips of the second group may be disposed on the second side of the second registering clock driver.

The signal lines of the first group may be coupled with the first memory module on the first side of the first registering clock driver, and the signal lines of the second group may be coupled with the second memory module on the second side of the second registering clock driver.

The first memory chips of the first group may exchange data directly with the signal lines of the first group, and the first memory chips of the second group may exchange data with the signal lines of the first group through the first memory chips of the first group.

The second memory chips of the first group may exchange data directly with the signal lines of the second group, and the second memory chips of the second group may exchange data with the signal lines of the second group through the second memory chips of the first group.

The first memory module may further include first data buses suitable for transferring data between the first memory chips of the first group and the first memory chips of the second group, and the second memory module may further include second data buses suitable for transferring data between the second memory chips of the first group and the second memory chips of the second group.

The first memory chips of the first group may exchange data with the signal lines of the first group in the case where a first path is selected, and the first memory chips of the first group may transfer data between the first data buses and the signal lines of the first group in the case where a second path is selected.

The second memory chips of the first group may exchange data with the signal lines of the second group in the case where a third path is selected, and the second memory chips of the first group may transfer data between the second data buses and the signal lines of the second group in the case where a fourth path is selected.

The first memory chips of the first group may be disposed in a first row, and the first memory chips of the second group may be disposed in a second row.

The second memory chips of the first group may be disposed in a first row, and the second memory chips of the second group may be disposed in a second row.

One or more of the signal lines of the first group and the second group may be disposed alternately with each other.

The first memory module may further include a plurality of first buffer chips each of which is coupled between one or more of the signal lines of the first group and one or more of the first memory chips corresponding thereto.

The second memory module may further include a plurality of second buffer chips each of which is coupled between one or more of the signal lines of the second group, and one or more of the second memory chips corresponding thereto.

Each of the first buffer chips may transfer data between the corresponding first memory chips and the signal lines of the first group which are coupled thereto, and each of the second buffer chips may transfer data between the corresponding second memory chips and the signal lines of the second group which are coupled thereto.

The first memory chips of the first group may be disposed in a first row, and the first memory chips of the second group may be disposed in a second row.

Each of the first buffer chips may correspond to one or more of the first memory chips of the first group and one or more of the first memory chip of the second group.

The second memory chips of the first group may be disposed in a first row, and the second memory chips of the second group may be disposed in a second row.

Each of the second buffer chips may correspond to one or more of the second memory chips of the first group and one or more of the second memory chips of the second group.

One or more of the signal lines of the first group and the second group may be disposed alternately with each other.

In an embodiment, a memory system may include: a memory controller; a first memory module comprising first and second groups of a plurality of first memory chips, a first registering clock driver and first and second groups of a plurality of first buffer chips; a second memory module comprising first and second groups of a plurality of second memory chips, a second registering clock driver and first and second groups of a plurality of second buffer chips; a channel comprising first and second groups of signal lines; a plurality of first data buses coupling each memory chip of the first group of the first memory chips with a corresponding memory chip of the second group of the first memory chips; a plurality of second data buses coupling each memory chip of the first group of the second memory chips with a corresponding memory chip of the second group of the second memory chips, and wherein all of the first memory chips of the first memory module are controlled by the memory controller by employing the first group of the signal lines, and all of the second memory chips of the second memory module are controlled by the memory controller by employing the second group of the signal lines.

The first memory chips of the first group may exchange data with the signal lines of the first group through the first buffer chips of the first group, and the first memory chips of the second group may exchange data with the signal lines of the first group through the first data buses, the first memory chips of the first group, and the first buffer chips of the first group.

The second memory chips of the second group may exchange data with the signal lines of the second group through the second buffer chips of the second group, and the second memory chips of the first group may exchange data with the signal lines of the second group through the second data buses, the second memory chips of the second group and the second buffer chips of the second group.

The first and second memory modules may further comprise a first and a second path selection units, respectively, for selecting a data path.

DETAILED DESCRIPTION

Figure 1:
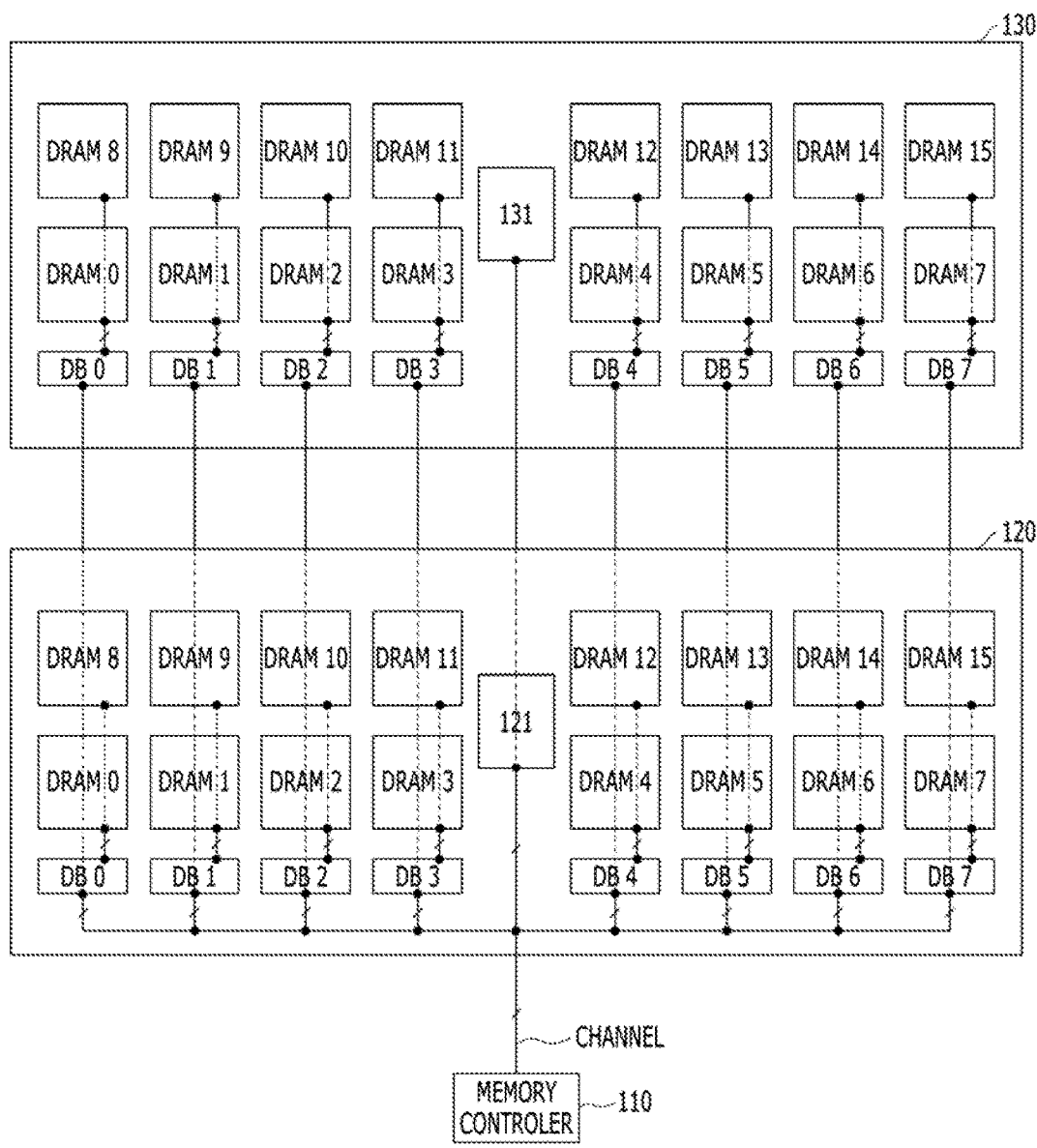
FIG. 1 is a configuration diagram illustrating a memory system including a memory controller and two memory modules.

Although, various embodiments are described below in more detail with reference to the accompanying drawings, we note that the present invention may, however, be embodied in different forms and should not be construed as being limited only to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

We further note that in the following description, numerous specific details are set forth in for providing a thorough understanding of the present invention. However, as would be apparent to those skilled in the relevant art, the present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described with reference to the attached drawings.

Figure 2:
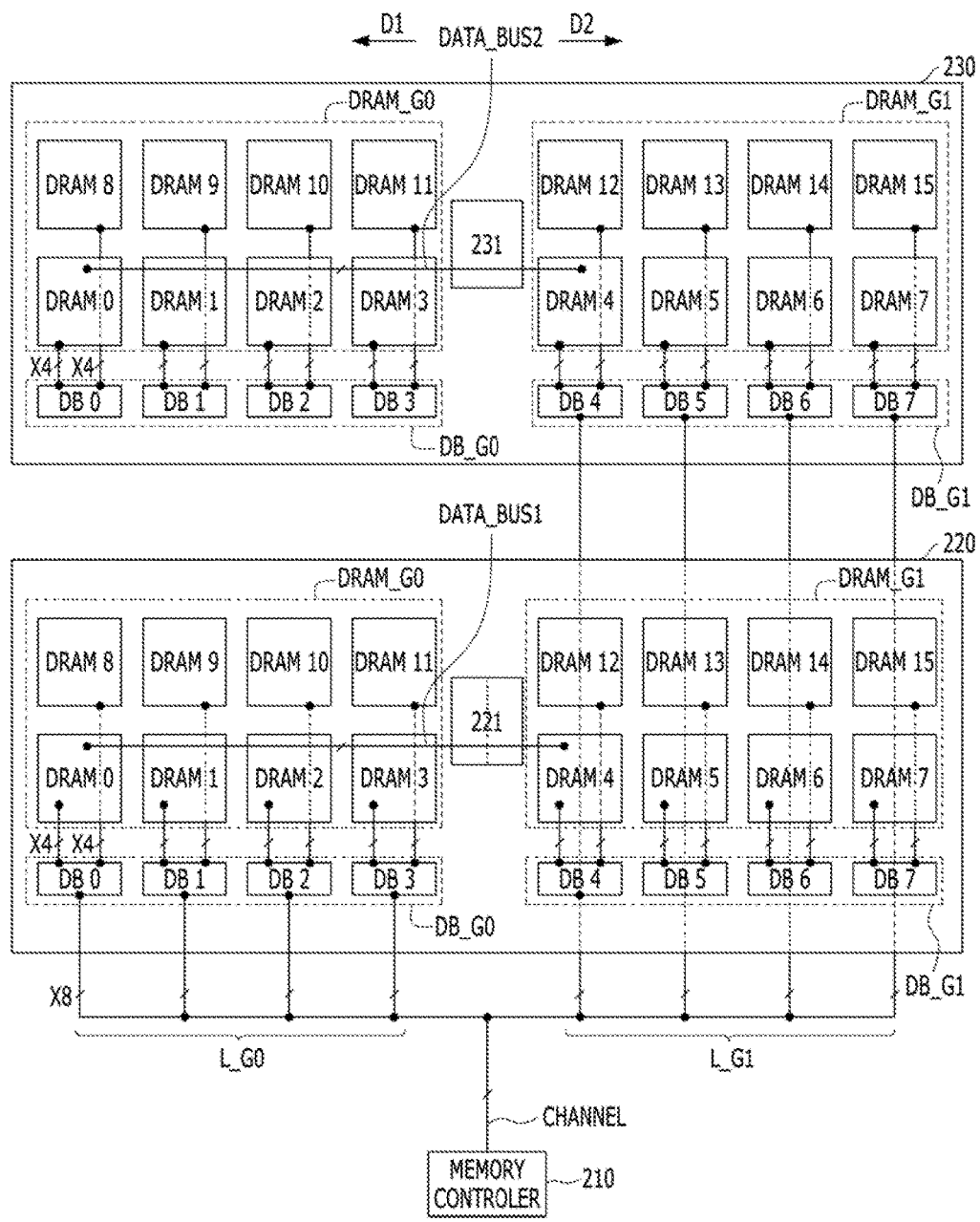
FIG. 2 is a configuration diagram illustrating a memory system according to an embodiment of the present invention.

FIG. 2 is a configuration diagram illustrating a memory system according to an embodiment of the present invention.

Referring to FIG. 2, the memory system may include a memory controller 210, a first memory module 220, and a second memory module 230.

The first and second memory modules 220 and 230 may include a plurality of memory chips DRAM0 to DRAM15, respective registering clock drivers 221 and 231, and a plurality of buffer chips DB0 to DB7.

Operation of the memory chips DRAM0 to DRAM15 may be controlled by the memory controller 210 via a command signal, an address signal and a clock signal provided from the memory controller 210. The memory chips DRAM0 to DRAM15 may thus be controlled to store data provided from the memory controller 210 and/or may read out stored data to the memory controller 210.

The memory chips DRAM0 to DRAM15 in each of the first and second memory modules 220 and 230 may be divided into first and second groups DRAM_G0 and DRAM_G1. The first and second groups DRAM_G1 and DRAM_G2 in each of the memory modules 220 and 230 may be disposed in first and second sides D1 and D2 of the registering clock drivers 221 and 231, respectively. In each of the memory modules 220 and 230, the memory chips DRAM0 to DRAM15 may be arranged in 2 rows and 8 columns.

In operation, the registering clock drivers 221 and 231 may transfer to the plurality of respective memory chips DRAM0 to DRAM15 the command signal, the address signal and the clock signal provided from the memory controller 210. It is noted that the number of memory chips in each module and their arrangement in rows and columns may vary from the illustrated embodiment of FIG. 2 without departing from the scope of the present invention.

Each of the buffer chips DB0 to DB7 of each module 220 and 230 may buffer the data transferred between the memory controller 210 and one or more corresponding memory chips among the plurality of memory chips DRAM0 to DRAM15.

The buffer chips DB0 to DB7 of the first and second memory modules 220 and 230 may be divided into a first group DB_G0 disposed in the first side D1 and a second group DB_G1 disposed in the second side D2.

Signals are transferred between the memory controller 210 and the memory modules 220 and 230 through a channel CHANNEL. The channel CHANNEL may include a plurality of signal lines divided into first and second groups L_G0 and L_G1.

In the first memory module 220, the buffer chips DB0 to DB3 of the first group DB_G0 may be coupled with the signal lines of the first group L_G0, and in the second memory module 230, the buffer chips DB4 to DB7 of the second group DB_G1 may be coupled with the signal lines of the second group L_G1. Each of the buffer chips DB0 to DB7 may be coupled with two memory chips of the same column.

The memory chips DRAM0 to DRAM3 and DRAM8 to DRAM11 of the first group DRAM_G0 and the memory chips DRAM4 to DRAM7 and DRAM12 to DRAM15 of the second group DRAM_G1 of geometrically corresponding disposition may respectively correspond to each other. For example, referring to FIG. 2, the memory chip DRAM0 of the first group DRAM_G0 and the memory chip DRAM4 of the second group DRAM_G1 have geometrically corresponding disposition (i.e., left-lower side of the first and second groups DRAM_G0 and DRAM_G1).

In the memory modules 220 and 230, data buses may be coupled between corresponding memory chips among the memory chips DRAM0 to DRAM3 and DRAM8 to DRAM11 of the first group DRAM_G0 and the memory chips DRAM4 to DRAM7 and DRAM12 to DRAM15 of the second group DRAM_G1. For example, referring to FIG. 2, the memory chip DRAM0 of the first group DRAM_G0 and the memory chip DRAM4 of the second group DRAM_G1 are coupled to each other through data buses DATA_BUS1 and DATA_BUS2. While only the data buses DATA_BUS1 and DATA_BUS2 coupled between the memory chip DRAM0 of the first group DRAM_G0 and the memory chip DRAM4 of the second group DRAM_G1 are illustrated in FIG. 2 for the sake of convenience in illustration, it is to be noted that the data buses may be coupled between each of all the memory chips DRAM0 to DRAM3 and DRAM8 to DRAM11 of the first group DRAM_G0 and each of all the memory chips DRAM4 to DRAM7 and DRAM12 to DRAM15 of the second group DRAM_G1.

That is to say, in each of the memory modules 220 and 230, a data bus may be coupled between the memory chip DRAM1 and the memory chip DRAM5, a data bus may be coupled between the memory chip DRAM2 and the memory chip DRAM6, a data bus may be coupled between the memory chip DRAM3 and the memory chip DRAM7, a data bus may be coupled between the memory chip DRAM8 and the memory chip DRAM12, a data bus may be coupled between the memory chip DRAM9 and the memory chip DRAM13, a data bus may be coupled between the memory chip DRAM10 and the memory chip DRAM14, and a data bus may be coupled between the memory chip DRAM11 and the memory chip DRAM15. The data buses coupled between these corresponding memory chips may be the same as the first and second data buses DATA_BUS1 and DATA_BUS2 which are illustrated in FIG. 2 for memory chips DRAM0 and DRAM 4. Illustration of all these data busses is omitted for the sake of convenience in illustration.

In the memory system of FIG. 2, the first memory module 220 may communicate with the memory controller 210 through the signal lines of the first group L_G0, and the second memory module 230 may communicate with the memory controller 210 through the signal lines of the second group L_G1.

In detail, the memory chips DRAM0 to DRAM3 and DRAM8 to DRAM11 of the first group DRAM_G0 of the first memory module 220 may exchange data with the signal lines of the first group L_G0 through the buffer chips DB0 to DB3 of the first group DB_G0. The memory chips DRAM4 to DRAM7 and DRAM12 to DRAM15 of the second group DRAM_G1 of the first memory module 220 may exchange data with the signal lines of the first group L_G0 through the memory chips DRAM0 to DRAM3 and DRAM8 to DRAM11 of the first group DRAM_G0 and the buffer chips DB0 to DB3 of the first group DB_G0.

The memory chips DRAM4 to DRAM7 and DRAM12 to DRAM15 of the second group DRAM_G1 of the second memory module 230 may exchange data with the signal lines of the second group L_G1 through the buffer chips DB4 to DB7 of the second group DB_G1. The memory chips DRAM0 to DRAM3 and DRAM8 to DRAM11 of the first group DRAM_G0 of the second memory module 230 may exchange data with the signal lines of the second group L_G1 through the memory chips DRAM4 to DRAM7 and DRAM12 to DRAM15 of the second group DRAM_G1 and the buffer chips DB4 to DB7 of the second group DB_G1.

In other words, in the memory system of FIG. 2, each of the memory modules 220 and 230 uses for communication with the memory controller 210 only one half of the signal lines (i.e., one of the first and second groups L_G0 and L_G1 of the signal lines) included in the channel CHANNEL.

To this end, in the case of the first memory module 220, the memory chips DRAM4 to DRAM7 and DRAM12 to DRAM15 of the second group DRAM_G1 communicate with the memory controller 210 by using the buffer chips DB0 to DB3 of the first group DB_G0, instead of the buffer chips DB4 to DB7 of the second group DB_G1, through the memory chips DRAM0 to DRAM3 and DRAM8 to DRAM11 of the first group DRAM_G0.

Also, in the case of the second memory module 230, the memory chips DRAM0 to DRAM3 and DRAM8 to DRAM11 of the first group DRAM_G0 communicate with the memory controller 210 by using the buffer chips DB4 to DB7 of the second group DB_G1, instead of the buffer chips DB0 to DB3 of the first group DB_G0 through the memory chips DRAM4 to DRAM7 and DRAM12 to DRAM15 of the second group DRAM_G1.

For this operation, each of the plurality of memory chips DRAM0 to DRAM15 included in the first and second memory modules 220 and 230 may include therein a path selection unit for selecting the path of data. By using such a path selection unit, the respective memory chips DRAM0 to DRAM15 of the respective first and second groups DRAM_G0 and DRAM_G1 may output its data to a corresponding one of the buffer chips D80 to DB7 and may transfer the data of a corresponding memory chip of the other one of the first and second groups DRAM_G0 and DRAM_G1 to the corresponding one of the buffer chips DB0 to DB7. For example, each of the plurality of memory chips DRAM0 to DRAM15 may include a switch between its data path and the data path of the corresponding memory chip. Illustration of these switches is omitted for the sake of convenience in illustration.

In detail, in the first memory module 220, each of the memory chips DRAM0 to DRAM3 and DRAM8 to DRAM11 of the first group DRAM_G0 may exchange its data with a corresponding one of the buffer chips DB0 to DB3 of the first group DB_G0 in the case where a first path is selected. Further, in the first memory module 220, each of the memory chips DRAM0 to DRAM3 and DRAM8 to DRAM 11 of the first group DRAM_G0 may transfer data between a corresponding one of the memory chips DRAM4 to DRAM7 and DRAM12 to DRAM15 of the second group DRAM_G1 and the corresponding buffer chip DB0 to DB3 of the first group DB_G0 through the data bus DATA_BUS1 in the case where a second path is selected.

In the second memory module 230, each of the memory chips DRAM4 to DRAM7 and DRAM12 to DRAM15 of the second group DRAM_G1 may exchange its data with a corresponding one of the buffer chips DB4 to DB7 of the second group DB_G1 in the case where a third path is selected. Further, in the second memory module 230, each of the memory chips DRAM4 to DRAM7 and DRAM12 to DRAM15 of the second group DRAM_G1 may transfer data between a corresponding one of the memory chips DRAM0 to DRAM3 and DRAM8 to DRAM11 of the first group DRAM_G0 and the corresponding buffer chip DB4 to DB7 of the second group DB_G1 through the data bus DATA_BUS2 in the case where a fourth path is selected.

In the memory system of FIG. 2, the first memory module 220 may use the buffer chips DB0 to DB3 of the first group DB_G0 and the signal lines of the first group L_G0 rather than the buffer chips DB4 to DB7 of the second group DB_G1 and the signal lines of the second group L_G1 when communicating with the memory controller 210, and the second memory module 230 may use the buffer chips DB4 to DB7 of the second group DB_G1 and the signal lines of the second group L_G1 rather than the buffer chips DB0 to DB3 of the first group DB_G0 and the signal lines of the first group L_G0 when communicating with the memory controller 210.

Figure 3:
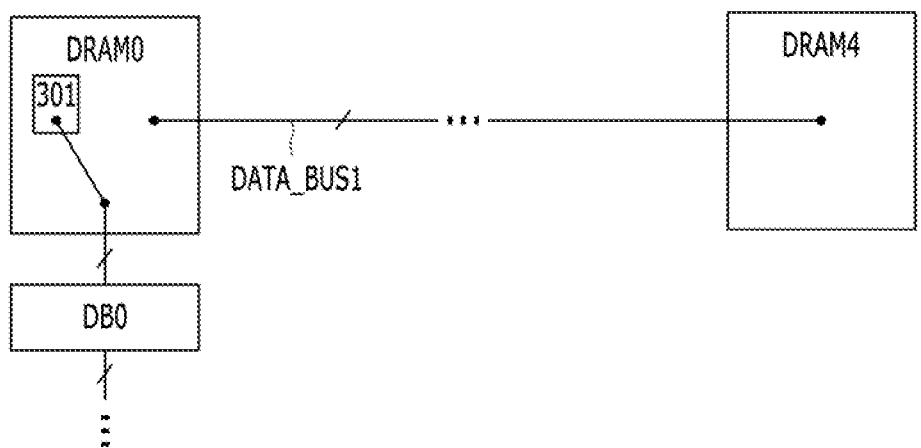
FIG. 3 is a diagram illustrating path selection of one of a first group of memory chips in a first memory module of FIG. 2.
Figure 3:
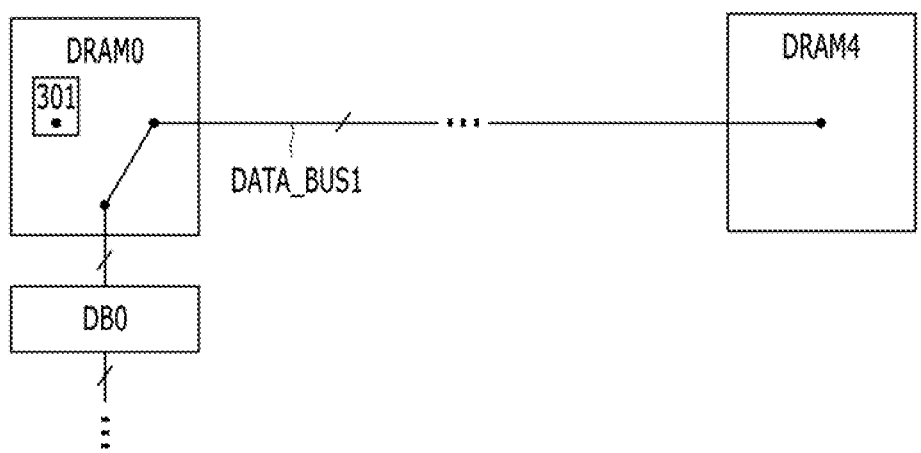

FIG. 3 is a diagram illustrating path selection of one (e.g. DRAM0) of the memory chips DRAM0 to DRAM3 and DRAM8 to DRAM11 of the first group DRAM_G0 in the first memory module 220. In FIG. 3, "CASE1" represents a path through which data is transferred in the case where the first path is selected, and "CASE2" represents a path through which data is transferred in the case where the second path is selected.

Referring to "CASE1" when the first path is selected, the memory chip DRAM0 may transfer data between its internal circuit 301 and the buffer chip DB0 of the first group DB_G0. Referring to CASE2, in the case where the second path is selected, the memory chip DRAM0 may transfer data through the data bus DATA_BUS1 between the memory chip DRAM4 of the second group DRAM_G1 and the buffer chip DB0 of the first group DB_G0.

Figure 4:
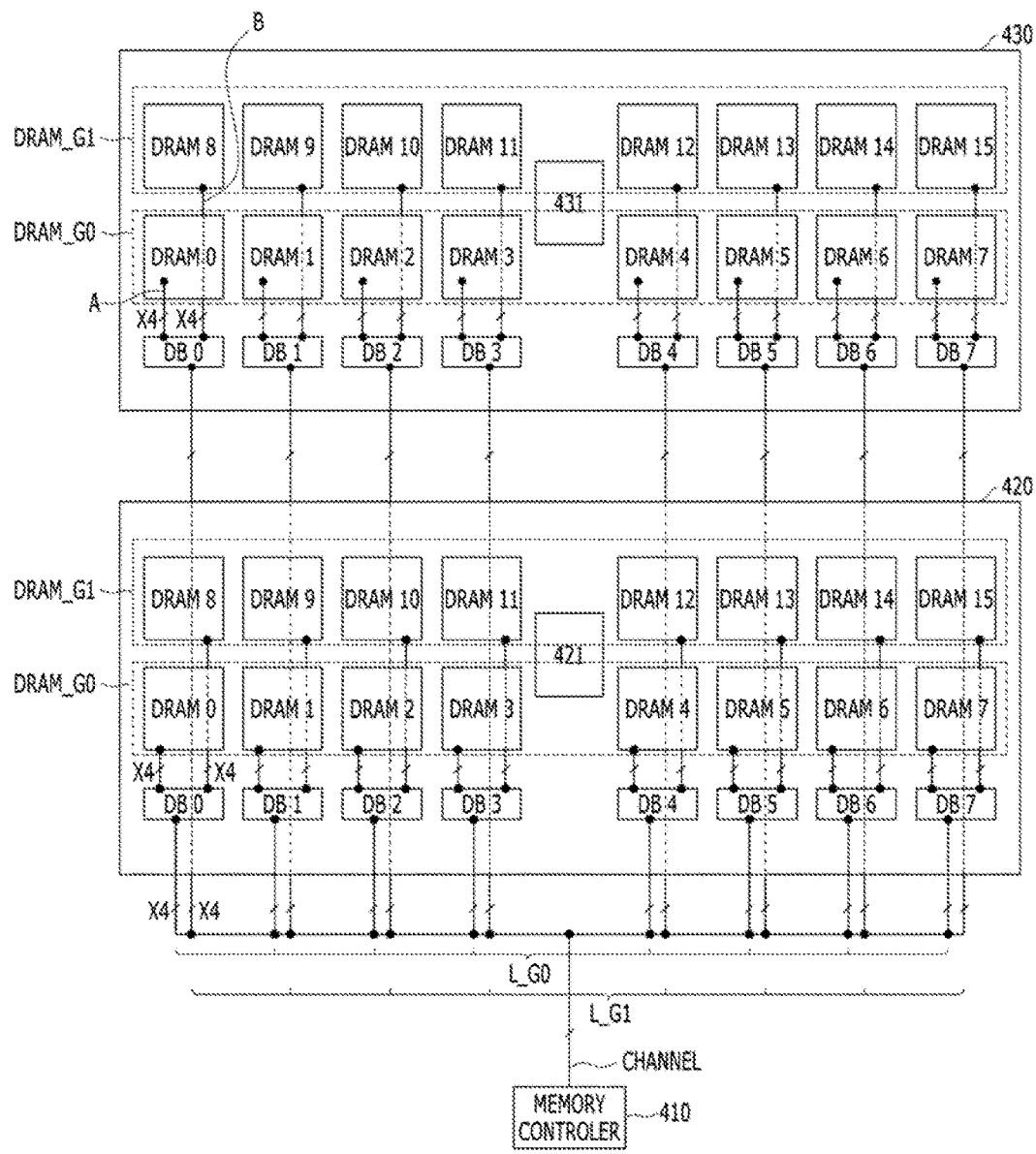
FIG. 4 is a configuration diagram illustrating a memory system according to another embodiment of the present invention.

FIG. 4 is a configuration diagram illustrating a memory system according to another embodiment of the present invention.

Referring to FIG. 4, the memory system may include a memory controller 410, a first memory module 420, and a second memory module 430.

The first and second memory modules 420 and 430 may include a plurality of memory chips DRAM0 to DRAM15, respective registering clock drivers 421 and 431, and a plurality of buffer chips DB0 to DB7.

In the memory system, one or more of the signal lines of a first group L_G0 and one or more of the signal lines of a second group L_G1 may be disposed alternately with each other. In the memory system of FIG. 4, it is exemplified that 4 signal lines of the first group L_G0 and 4 signal lines of the second group L_G1 are disposed alternately with each other.

In the memory modules 420 and 430, the memory chips DRAM0 to DRAM15 may be disposed in 2 rows and 8 columns. The memory chips DRAM0 to DRAM15 included in each of the first and second memory modules 420 and 430 may be divided into the memory chips DRAM0 to DRAM7 of a first group DRAM_G0 disposed in a first row and the memory chips DRAM8 to DRAM15 of a second group DRAM_G disposed in a second row.

Each of the buffer chips DB0 to DB7 may buffer the data transferred between the memory controller 410 and one or more corresponding memory chips among the plurality of memory chips DRAM0 to DRAM15.

Each of the buffer chips DB0 to DB7 of the first memory module 420 may be coupled between two memory chips of the same column and one or more (e.g., four) signal lines of the first group L_G0. Each of the buffer chips DB0 to DB7 of the second memory module 430 may be coupled between two memory chips of the same column and one or more (e.g., four) signal lines of the second group L_G1.

The buffer chips DB0 to DB7 of the first memory module 420 may transfer data between the memory chips DRAM0 to DRAM15 of the first and second groups DRAM_G0 and DRAM_G1 of the first memory module 420 and the signal lines of the first group L_G0, and the buffer chips DB0 to DB7 of the second memory module 430 may transfer data between the memory chips DRAM0 to DRAM15 of the first and second groups DRAM_G0 and DRAM_G1 of the second memory module 430 and the signal lines of the second group L_G1.

The memory chips DRAM0 to DRAM7 of the first group DRAM_G0 may exchange data with the buffer chips DB0 to DB7 through lines A. Further, the memory chips DRAM8 to DRAM15 of the second group DRAM_G may exchange data with the buffer chips DB0 to DB7 through lines B FIG. 5 is a diagram illustrating a communication path between each one of the memory chips DRAM0 to DRAM15 and the memory controller 410 included in the memory system of FIG. 4.

Figure 5:
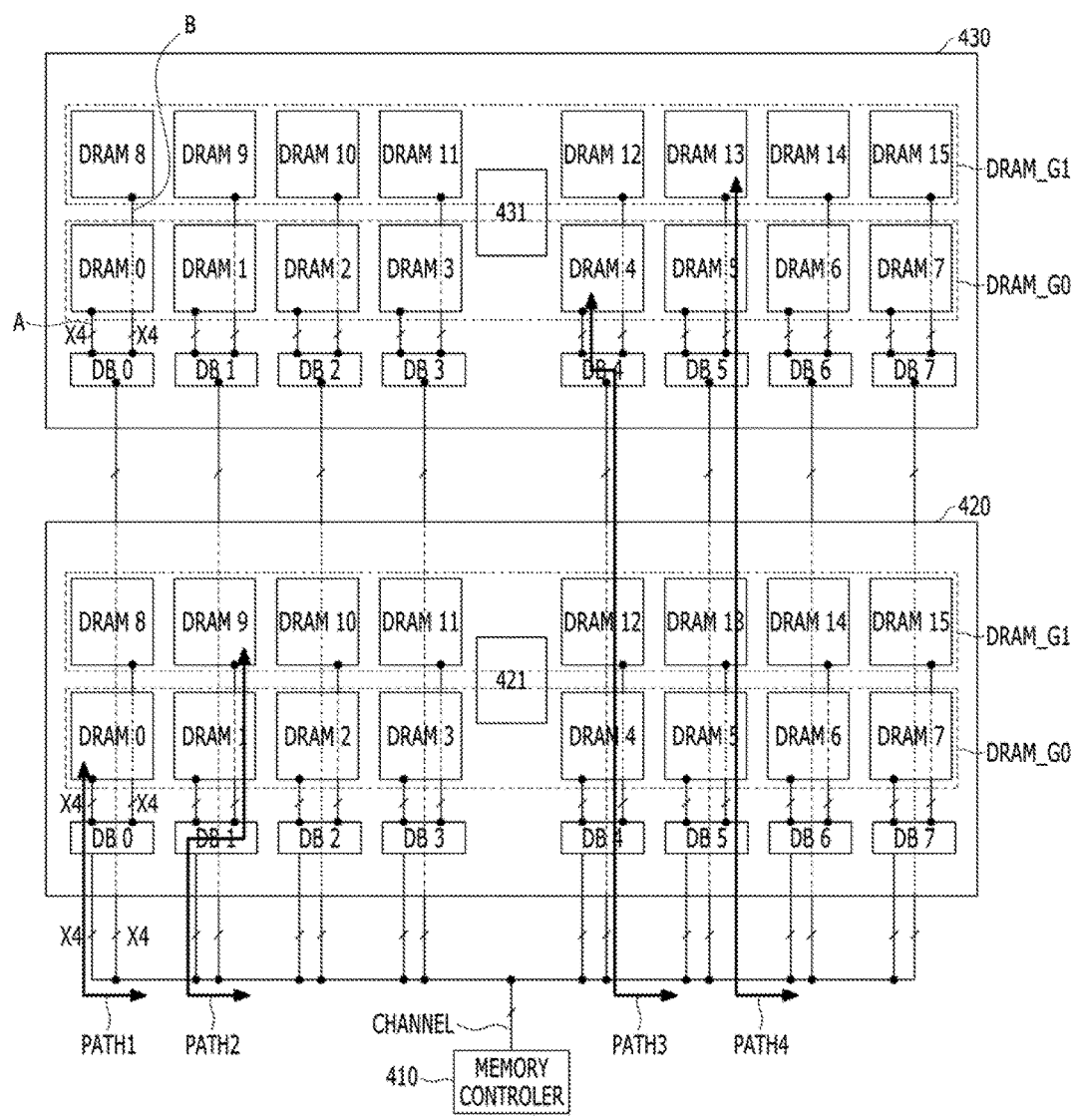
FIG. 5 is a diagram illustrating a communication path between each memory chip and a memory controller included in the memory system of FIG. 4.

Referring to FIG. 5, the memory chip DRAM0 of the first group DRAM_G0 of the first memory module 420 may communicate with the memory controller 410 through the lines A connected to the buffer chip DB0 of the first memory module 420 and the signal lines of the first group L_G0 ("PATH1" in FIG. 5). The memory chip DRAM9 of the second group DRAM_G1 of the first memory module 420 may communicate with the memory controller 410 through the lines B connected to the buffer chip DB1 of the first memory module 420 and the signal lines of the first group L_G0 ("PATH2" in FIG. 5). The memory chip DRAM4 of the first group DRAM_G0 of the second memory module 430 may communicate with the memory controller 410 through the lines A connected to the buffer chip DB4 of the second memory module 430 and the signal lines of the second group L_G1 ("PATH3" in FIG. 5). The memory chip DRAM13 of the second group DRAM_G1 of the second memory module 430 may communicate with the memory controller 410 through the lines B connected to the buffer chip DB5 of the second memory module 430 and the signal lines of the second group L_G1 ("PATH4" in FIG. 5).

The path PATH2 may bypass the memory chip DRAM1 of the first memory module 420. The path PATH3 may bypass the memory chips DRAM4 and DRAM12 of the first memory module 420 through the signal lines of the second group L_G1. The path PATH4 may bypass the memory chip DRAM5 of the second memory module 430, and may bypass the memory chips DRAM5 and DRAM13 of the first memory module 420 through the signal lines of the second group L_G1.

Similarly to the memory system of FIG. 2, in the memory system of FIG. 4, each of the memory modules 420 and 430 uses for communication with the memory controller 410 only one half of the signal lines (i.e., one of the first and second groups L_G0 and L_G1 of the signal lines) included in the channel CHANNEL. However, by changing connection relationship of the signal lines of the first and second groups L_G0 and L_G1, advantages are provided in that the data buses DATA_BUS1 and DATA_BUS2 of FIG. 2 are not needed.

Figure 6:
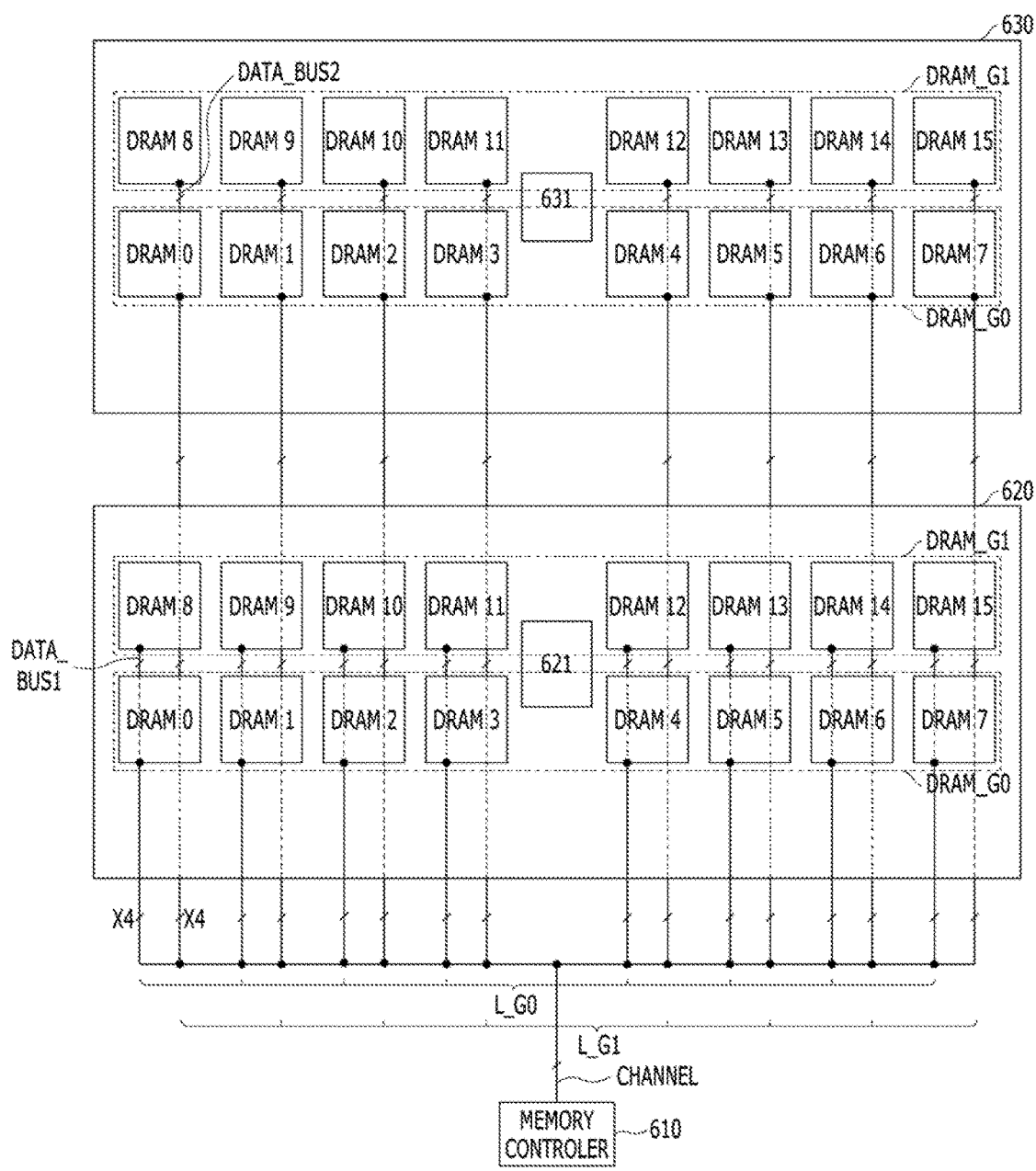
FIG. 6 is a configuration diagram illustrating a memory system according to yet another embodiment of the present invention.

FIG. 6 is a configuration diagram illustrating a memory system according to yet another embodiment of the present invention.

Referring to FIG. 6, the memory system may include a memory controller 610, a first memory module 620, and a second memory module 630.

The first and second memory modules 620 and 630 may include a plurality of memory chips DRAM0 to DRAM15, and registering clock drivers 621 and 631, respectively. Unlike the memory chips of FIGS. 2 and 4, the memory chips of FIG. 6 may communicate with the memory controller 610 without using buffer chips.

In the memory system, one or more of the signal lines of a first group L_G0 and one or more of the signal lines of a second group L_G1 may be disposed alternately with each other. In the memory system of FIG. 6, it is exemplified that 4 signal lines of the first group L_G0 and 4 signal lines of the second group L_G1 are disposed alternately with each other.

In the memory modules 620 and 630, the memory chips DRAM0 to DRAM15 may be disposed in 2 rows and 8 columns. The memory chips DRAM0 to DRAM15 included in each of the first and second memory modules 620 and 630 may be divided into the memory chips DRAM0 to DRAM7 of a first group DRAM_G0 disposed in a first row and the memory chips DRAM8 to DRAM15 of a second group DRAM_G1 disposed in a second row.

In FIG. 6, the memory chips DRAM0 to DRAM7 of the first group DRAM_G0 of the first memory module 620 may be coupled with one or more signal lines of the first group L_G0. In FIG. 6, the memory chips DRAM0 to DRAM7 of the first group DRAM_G0 of the second memory module 630 may be coupled to one or more signal lines of the second group L_G1.

The memory chips DRAM0 to DRAM7 of the first group DRAM_G0 and the memory chips DRAM8 to DRAM15 of the second group DRAM_G1 of geometrically corresponding disposition may respectively correspond to each other. For example, referring to FIG. 6, the memory chip DRAM0 of the first group DRAM_G0 and the memory chip DRAM8 of the second group DRAM_G1 have geometrically corresponding disposition (i.e., leftmost side of the first and second groups DRAM_G0 and DRAM_G1).

In the memory modules 620 and 630, data buses DATA_BUS1 and DATA_BUS2 may be coupled between corresponding memory chips among the memory chips DRAM0 to DRAM7 of the first group DRAM_G0 and the memory chips DRAM8 to DRAM15 of the second group DRAM_G1. For example, referring to FIG. 6, the memory chip DRAM0 of the first group DRAM_G0 and the memory chip DRAM8 of the second group DRAM_G1 are coupled to each other through the data bus DATA_BUS1 in the first memory module 620. For example, referring to FIG. 6, the memory chip DRAM0 of the first group DRAM_G0 and the memory chip DRAM8 of the second group DRAM_G1 are coupled to each other through the data bus DATA_BUS2 in the second memory module 630.

In the memory system of FIG. 6, the first memory module 620 may communicate with the memory controller 610 through the signal lines of the first group L_G0, and the second memory module 630 may communicate with the memory controller 610 through the signal lines of the second group L_G1.

In detail, the memory chips DRAM0 to DRAM7 of the first group DRAM_G0 of the first memory module 620 may directly exchange data with the signal lines of the first group L_G0. The memory chips DRAM8 to DRAM15 of the second group DRAM_G1 of the first memory module 620 may exchange data with the signal lines of the first group L_G0 through the memory chips DRAM0 to DRAM7 of the first group DRAM_G0.

The memory chips DRAM0 to DRAM7 of the first group DRAM_G0 of the second memory module 630 may directly exchange data with the signal lines of the second group L_G1. The memory chips DRAM8 to DRAM15 of the second group DRAM_G1 of the second memory module 630 may exchange data with the signal lines of the second group L_G1 through the memory chips DRAM0 to DRAM7 of the first group DRAM_G0.

For this operation, each of the plurality of memory chips DRAM0 to DRAM15 included in the first and second memory modules 620 and 630 may include therein a path selection unit for selecting the path of data. By using such a path selection unit, the respective memory chips DRAM0 to DRAM15 of the respective first and second groups DRAM_G0 and DRAM_G1 may output its data to the signal lines coupled thereto and may transfer the data of a corresponding memory chip of the other one of the first and second groups DRAM_G0 and DRAM_G1 to the signal lines coupled thereto.

In detail, in the first memory module 620, each of the memory chips DRAM0 to DRAM7 of the first group DRAM_G0 may exchange its data with the signal lines of the first group L_G0 in the case where a first path is selected. Further, in the first memory module 620, each of the memory chips DRAM0 to DRAM7 of the first group DRAM_G0 may transfer data between a corresponding one of the memory chips DRAM8 to DRAM15 of the second group DRAM_G1 and the signal lines of the first group L_G0 through the data bus DATA_BUS1 in the case where a second path is selected.

In the second memory module 620, each of the memory chips DRAM0 to DRAM7 of the first group DRAM_G0 may exchange its data with the signal lines of the second group L_G1 in the case where a third path is selected. Further, in the second memory module 620, each of the memory chips DRAM0 to DRAM7 of the first group DRAM_G0 may transfer data between a corresponding one of the memory chips DRAM8 to DRAM15 of the second group DRAM_G1 and the signal lines of the second group L_G1 through the data bus DATA_BUS2 in the case where a fourth path is selected.

Figure 7:
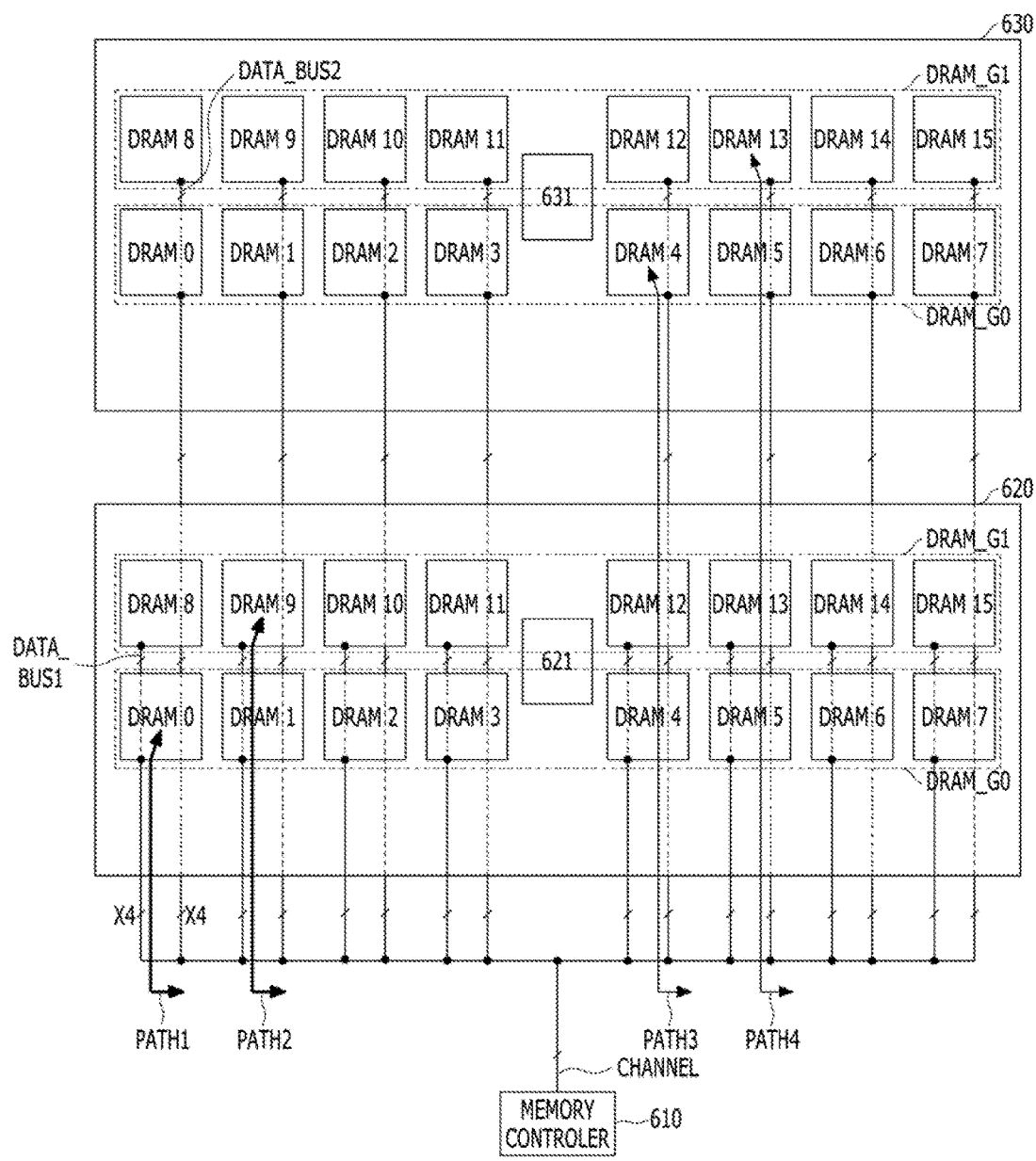
FIG. 7 is a diagram illustrating a communication path between each memory chip and a memory controller included in the memory system of FIG. 6.

FIG. 7 is a diagram illustrating a communication path between each one of the memory chips DRAM0 to DRAM15 and the memory controller 610 included in the memory system of FIG. 6.

Referring to FIG. 7, the memory chip DRAM0 of the first group DRAM_G0 of the first memory module 620 may communicate with the memory controller 610 directly through the signal lines of the first group L_G0 ("PATH1" in FIG. 7). The memory chip DRAM9 of the second group DRAM_G1 of the first memory module 620 may communicate with the memory controller 610 through the memory chip DRAM1 of the first group DRAM_G0 and the signal lines of the first group L_G0 ("PATH2" in FIG. 7). The memory chip DRAM4 of the first group DRAM_G0 of the second memory module 630 may communicate with the memory controller 610 directly through the signal lines of the second group L_G1 ("PATH3" in FIG. 7). The memory chip DRAM13 of the second group DRAM_G1 of the second memory module 630 may communicate with the memory controller 610 through the memory chip DRAM5 of the first group DRAM_G0 and the signal lines of the second group L_G1 ("PATH4" in FIG. 7).

The path PATH2 passes through the memory chip DRAM1 of the first memory module 620 by the data bus DATA_BUS1. The path PATH3 may bypass the memory chips DRAM4 and DRAM12 of the first memory module 620 through the signal lines of the second group L_G1. The path PATH4 passes through the memory chip DRAM5 of the second memory module 630 by the data bus DATA_BUS2, and may bypass the memory chips DRAM5 and DRAM13 of the first memory module 620 through the signal lines of the second group L_G1.

Figure 8:
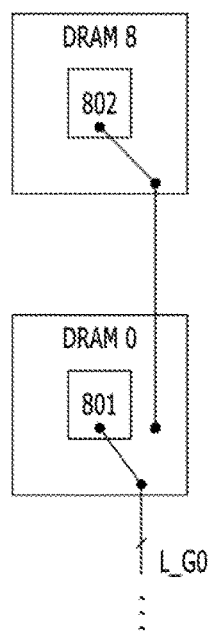
FIG. 8 is a diagram illustrating path selection of one of a first group of memory chips in a first memory module of FIG. 6.
Figure 8:
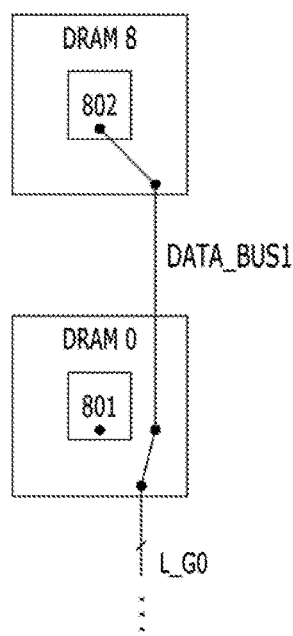

FIG. 8 is a diagram illustrating path selection of one (e.g. DRAM0) of the memory chips DRAM0 to DRAM7 of the first group DRAM_G0 in the first memory module 620. In FIG. 8, "CASE1" represents a path through which data is transferred in the case where the first path is selected, and "CASE2" represents a path through which data is transferred in the case where the second path is selected.

Referring to "CASE1" when the first path is selected, the memory chip DRAM0 may transfer data between its internal circuit 801 and the signal lines of the first group L_G0. Referring to "CASE2" when the second path is selected, the memory chip DRAM0 may transfer data between an internal circuit 802 of the memory chip DRAM8 of the second group DRAM_G1 the signal lines of the first group L_G0 through the data bus DATA_BUS1

Excluding other signal lines, e.g., signal lines coupled to the registering clock drivers 221, 231, 421, 431, 621 and 631, the signal lines for the data communication of the memory controllers 210, 410 and 610 and the memory modules 220, 230, 420, 430, 620 and 630 are illustrated.

In FIGS. 2, 4, 5, 6 and 7, a bundle of a plurality of lines is illustrated as one line. 'Xk (k is a natural number)' represents that one line illustrated corresponds to k number of lines. For example, 'X4' represents that one line illustrated corresponds to 4 lines. For reference, the reference symbols 'X4' and 'X8' are given for the leftmost lies among the lines illustrated, for the sake of convenience in illustration. However, it is to be understood that the remaining lines correspond to the same numbers of lines as the leftmost lines.

In the present technology, a channel for transferring signals between a memory module and a memory controller is configured in various methods, and through this, the loading of the channel may be reduced and the quality of signals may be improved.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
a memory controller;
a first memory module including first and second groups of first memory chips;
a second memory module including first and second groups of second memory chips; and
a channel including a first group of signal lines suitable for coupling the memory controller with the first memory module, and a second group of signal lines suitable for coupling the memory controller with the second memory module.

2. The memory system according to claim 1,
wherein the first memory module further includes first and second groups of first buffer chips,
wherein the second memory module further includes first and second groups of second buffer chips,
wherein the first buffer chips of the first group are coupled between the first memory chips of the first group and the signal lines of the first group, and
wherein the second buffer chips of the second group are coupled between the second memory chips of the second group and the signal lines of the second group.

3. The memory system according to claim 2,
wherein the first memory chips of the first group exchange data with the signal lines of the first group through the first buffer chips of the first group,
wherein the first memory chips of the second group exchange data with the signal lines of the first group through the first memory chips of the first group and the first buffer chips of the first group, wherein the second memory chips of the second group exchange data with the signal lines of the second group through the second buffer chips of the second group, and
wherein the second memory chips of the first group exchange data with the signal lines of the second group through the second memory chips of the second group and the second buffer chips of the second group.

4. The memory system according to claim 3,
wherein the first memory module further includes first data buses suitable for transferring data between the first memory chips of the first group and the first memory chips of the second group, and
wherein the second memory module further includes second data buses suitable for transferring data between the second memory chips of the first group and the second memory chips of the second group.

5. The memory system according to claim 4,
wherein the first memory chips of the first group exchange data with the first buffer chips of the first group in the case where a first path is selected,
wherein the first memory chips of the first group transfer data between the first memory chips of the second group coupled with the first data buses and the first buffer chips of the first group in the case where a second path is selected,
wherein the second memory chips of the second group exchange data with the second buffer chips of the second group in the case where a third path is selected, and
wherein the second memory chips of the second group transfer data between the second memory chips of the first group coupled with the second data buses and the second buffer chips of the second group in the case where a fourth path is selected.

6. The memory system according to claim 5,
wherein the first memory module further includes a first registering clock driver, and
wherein the second memory module further includes a second registering clock driver.

7. The memory system according to claim 6,
wherein the first memory chips of the first group and the first buffer chips of the first group are disposed on a first side of the first registering clock driver,
wherein the first memory chips of the second group and the first buffer chips of the second group are disposed on a second side of the first registering clock driver,
wherein the second memory chips of the first group and the second buffer chips of the first group are disposed on the first side of the second registering clock driver, and
wherein the second memory chips of the second group and the second buffer chips of the second group are disposed on the second side of the second registering clock driver.

8. The memory system according to claim 7,
wherein the signal lines of the first group are coupled with the first memory module on the first side of the first registering clock driver, and
wherein the signal lines of the second group are coupled with the second memory module on the second side of the second registering clock driver.

9. The memory system according to claim 1,
wherein the first memory chips of the first group exchange data directly with the signal lines of the first group, wherein the first memory chips of the second group exchange data with the signal lines of the first group through the first memory chips of the first group, wherein the second memory chips of the first group exchange data directly with the signal lines of the second group, and wherein the second memory chips of the second group exchange data with the signal lines of the second group through the second memory chips of the first group.

10. The memory system according to claim 9, wherein the first memory module further includes first data buses suitable for transferring data between the first memory chips of the first group and the first memory chips of the second group, and wherein the second memory module further includes second data buses suitable for transferring data between the second memory chips of the first group and the second memory chips of the second group.

11. The memory system according to claim 10, wherein the first memory chips of the first group exchange data with the signal lines of the first group in the case where a first path is selected, wherein the first memory chips of the first group transfer data between the first data buses and the signal lines of the first group in the case where a second path is selected, wherein the second memory chips of the first group exchange data with the signal lines of the second group in the case where a third path is selected, and wherein the second memory chips of the first group transfer data between the second data buses and the signal lines of the second group in the case where a fourth path is selected.

12. The memory system according to claim 11, wherein the first memory chips of the first group are disposed in a first row, and the first memory chips of the second group are disposed in a second row, and wherein the second memory chips of the first group are disposed in a first row, and the second memory chips of the second group are disposed in a second row.

13. The memory system according to claim 12, wherein one or more of the signal lines of the first group and the second group are disposed alternately with each other.

14. The memory system according to claim 1, wherein the first memory module further includes a plurality of first buffer chips each of which is coupled between one or more of the signal lines of the first group and one or more of the first memory chips corresponding thereto, and wherein the second memory module further includes a plurality of second buffer chips each of which is coupled between one or more of the signal lines of the second group and one or more of the second memory chips corresponding thereto.

15. The memory system according to claim 14, wherein each of the first buffer chips transfers data between the corresponding first memory chips and the signal lines of the first group which are coupled thereto, and wherein each of the second buffer chips transfers data between the corresponding second memory chips and the signal lines of the second group which are coupled thereto.

16. The memory system according to claim 15, wherein the first memory chips of the first group are disposed in a first row, and the first memory chips of the second group are disposed in a second row, wherein each of the first buffer chips corresponds to one or more of the first memory chips of the first group and one or more of the first memory chip of the second group, wherein the second memory chips of the first group are disposed in a first row, and the second memory chips of the second group are disposed in a second row, and wherein each of the second buffer chips corresponds to one or more of the second memory chips of the first group and one or more of the second memory chips of the second group.

17. The memory system according to claim 14, wherein one or more of the signal lines of the first group and the second group are disposed alternately with each other.

18. A memory system comprising:

a memory controller;

a first memory module comprising first and second groups of a plurality of first memory chips, a first registering clock driver and first and second groups of a plurality of first buffer chips;

a second memory module comprising first and second groups of a plurality of second memory chips, a second registering clock driver and first and second groups of a plurality of second buffer chips;

a channel comprising first and second groups of signal lines;

a plurality of first data buses coupling each memory chip of the first group of the first memory chips with a corresponding memory chip of the second group of the first memory chips; and a plurality of second data buses coupling each memory chip of the first group of the second memory chips with a corresponding memory chip of the second group of the second memory chips, wherein all of the first memory chips of the first memory module are controlled by the memory controller by employing the first group of the signal lines, and all of the second memory chips of the second memory module are controlled by the memory controller by employing the second group of the signal lines.

19. The memory system of claim 18, wherein the first memory chips of the first group exchange data with the signal lines of the first group through the first buffer chips of the first group, wherein the first memory chips of the second group exchange data with the signal lines of the first group through the first data buses, the first memory chips of the first group, and the first buffer chips of the first group, wherein the second memory chips of the first group exchange data with the signal lines of the second group through the second buffer chips of the second group, and wherein the second memory chips of the first group exchange data with the signal lines of the second group through the second data buses, the second memory chips of the second group and the second buffer chips of the second group.

20. The memory system of claim 18, wherein the first and second memory modules further comprise a first and a second path selection units, respectively, for selecting a data path.

* * * * *